(12) United States Patent
Eto (10) Patent No.: US 11,094,574 B2
(45) Date of Patent: Aug. 17, 2021

(54) SUBSTRATE SUPPORTING DEVICE AND PLASMA PROCESSING APPARATUS

(71) Applicant: TOSHIBA MEMORY CORPORATION, Minato-ku (JP)

(72) Inventor: Hideo Eto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 150 days.

(21) Appl. No.: 16/243,160

(22) Filed: Jan. 9, 2019

(65) Prior Publication Data

US 2020/0035536 A1    Jan. 30, 2020

(30) Foreign Application Priority Data

Jul. 24, 2018   (JP) .............................. JP2018-138413

(51) Int. Cl.
| | |
|---|---|
| *H01L 21/683* | (2006.01) |
| *H01L 21/687* | (2006.01) |
| *H01J 37/32* | (2006.01) |
| *H01L 21/67* | (2006.01) |

(52) U.S. Cl.
CPC .... *H01L 21/6833* (2013.01); *H01J 37/32724* (2013.01); *H01L 21/68742* (2013.01); *H01J 2237/3341* (2013.01); *H01L 21/67069* (2013.01)

(58) Field of Classification Search
CPC ........................ H01L 21/6874; H01L 21/6833
See application file for complete search history.

(56) References Cited

U.S. PATENT DOCUMENTS

| | | | | |
|---|---|---|---|---|
| 5,665,167 | A * | 9/1997 | Deguchi | C23C 14/50 118/728 |
| 6,528,767 | B2 * | 3/2003 | Bagley | C03C 17/002 118/50.1 |
| 2002/0011204 | A1 * | 1/2002 | Gujer | C23C 16/4586 118/500 |
| 2002/0180609 | A1 * | 12/2002 | Ding | G01N 27/333 340/633 |
| 2004/0218339 | A1 * | 11/2004 | Nakamura | H01L 21/6831 361/234 |

(Continued)

FOREIGN PATENT DOCUMENTS

| | | |
|---|---|---|
| JP | 2000/195935 | * 12/1998 |
| JP | 2000-195935 | 7/2000 |

(Continued)

OTHER PUBLICATIONS

JP_2000195935_A_I JP Dec. 1998 Eng machine trans (Year: 1998).*

*Primary Examiner* — Joseph A Miller, Jr.
(74) *Attorney, Agent, or Firm* — Oblon, McClelland, Maier & Neustadt, L.L.P.

(57) ABSTRACT

According to one embodiment, a substrate supporting device is a substrate supporting device that supports a substrate in a processing container of a plasma processing apparatus, the substrate supporting device including an electrostatic chuck including a placing plate containing at least a ceramic and having the substrate electrostatically attracted by the placing plate, a lift pin configured to be storable inside the electrostatic chuck and which delivers the substrate to and from the electrostatic chuck, and a cover containing at least a ceramic of a same type as the placing plate and configured to be attachable to and detachable from the lift pin.

21 Claims, 5 Drawing Sheets

AT WAFER TRANSFER (56) References Cited

U.S. PATENT DOCUMENTS

| | | | |
|---|---|---|---|
| 2005/0205110 A1* | 9/2005 | Kao | C23C 14/022 134/1.1 |
| 2011/0315080 A1* | 12/2011 | Choi | H01L 21/68742 118/723 E |
| 2018/0023193 A1* | 1/2018 | Baluja | H01J 37/32715 134/1.1 |
| 2018/0025890 A1 | 1/2018 | Choi et al. | |
| 2018/0261481 A1 | 9/2018 | Eto | |

FOREIGN PATENT DOCUMENTS

| | | |
|---|---|---|
| JP | 2004-259974 | 9/2004 |
| JP | 2012-519393 | 8/2012 |
| JP | 2018-152542 | 9/2018 |

* cited by examiner

AT WAFER TRANSFER

FIG.3B

AT WAFER ATTRACTION

AT WAFER TRANSFER

FIG.5B

AT WAFER ATTRACTION

SUBSTRATE SUPPORTING DEVICE AND PLASMA PROCESSING APPARATUS

CROSS-REFERENCE TO RELATED APPLICATIONS

This application is based upon and claims the benefit of priority from Japanese Patent Application No. 2018-138413, filed on Jul. 24, 2018; the entire contents of which are incorporated herein by reference.

FIELD

Embodiments described herein relate generally to a substrate supporting device and a plasma processing apparatus.

BACKGROUND

In plasma processing apparatuses, an electrostatic chuck and a lift pin are sometimes used as a substrate supporting device that supports a substrate in a processing container. The electrostatic chuck electrostatically attracts the substrate in the processing container. The lift pin delivers the substrate to and from the electrostatic chuck. In the vicinity of the lift pin, abnormal discharge sometimes occurs at the time of plasma processing for the substrate.

DETAILED DESCRIPTION

A substrate supporting device according to an embodiment is a substrate supporting device that supports a substrate in a processing container of a plasma processing apparatus, the substrate supporting device including an electrostatic chuck including a placing plate containing at least a ceramic and having the substrate electrostatically attracted by the placing plate, a lift pin configured to be storable inside the electrostatic chuck and which delivers the substrate to and from the electrostatic chuck, and a cover containing at least a ceramic of a same type as the placing plate and configured to be attachable to and detachable from the lift pin.

Hereinafter, the present invention will be described in detail with reference to the drawings. Note that the present invention is not limited by the following embodiments. Further, constituent elements in the following embodiments include those easily assumed by those skilled in the art or those substantially the same.

First Embodiment

A substrate supporting device and a plasma processing apparatus according to a first embodiment will be described with reference to FIG. 1 to FIGS. 3A and 3B.

(Configuration Example of Plasma Processing Apparatus)

Figure 1:
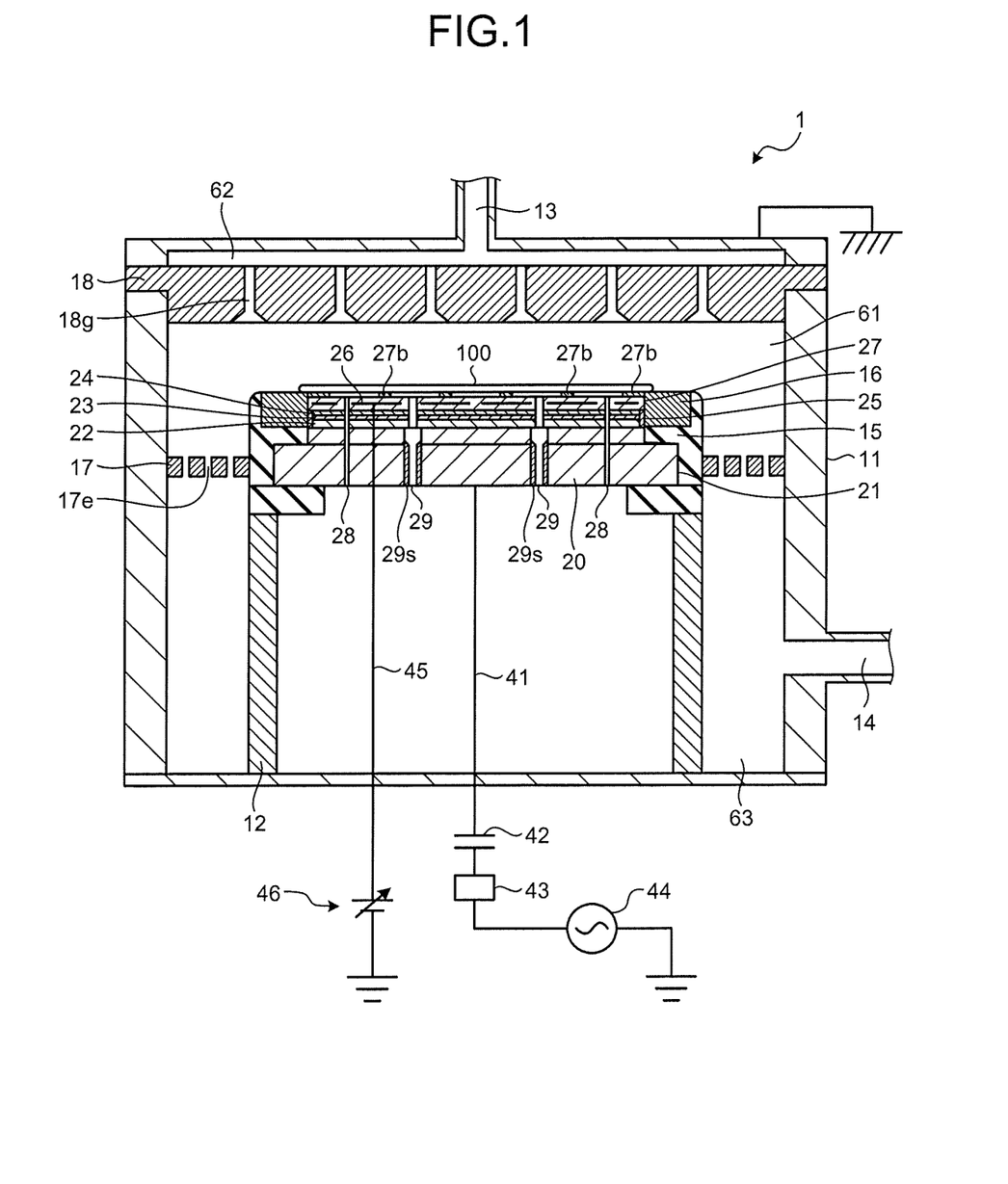
FIG. 1 is a cross-sectional view schematically illustrating an example of a configuration of a plasma processing apparatus according to a first embodiment.

FIG. 1 is a cross-sectional view schematically illustrating an example of a configuration of a plasma processing apparatus 1 according to a first embodiment. The plasma processing apparatus 1 is configured as a reactive ion etching (RIE) apparatus, for example.

As illustrated in FIG. 1, the plasma processing apparatus 1 includes a chamber 11 as a processing container that is airtightly configured and is made of aluminum, for example.

In the vicinity of an upper portion of the chamber 11, a gas supply port 13 is provided. A gas supply device (not illustrated) is connected to the gas supply port 13 through piping, and a processing gas to be used at the time of plasma processing is supplied to the gas supply port 13.

A shower head 18 functioning as an upper electrode is provided in the vicinity of the upper portion of the chamber 11 and below the gas supply port 13. The shower head 18 is provided with a plurality of gas discharge ports 18g penetrating in a plate thickness direction. The processing gas supplied through the gas supply port 13 is introduced into the chamber 11 through the gas discharge ports 18g.

An electrostatic chuck 20 is disposed below the shower head 18 to face the shower head 18. The electrostatic chuck 20 horizontally supports a wafer 100 to be processed and functions as a lower electrode. A loading in/out port (not illustrated) for the wafer 100 is provided in a side surface of the chamber 11, and the wafer 100 is placed on the electrostatic chuck 20 in the chamber 11 with a robot arm (not illustrated) through the loading in/out port.

The electrostatic chuck 20 is supported on a supporting portion 12 that projects in a cylindrical manner vertically upward from a bottom wall in the vicinity of the center of the chamber 11. The supporting portion 12 supports the electrostatic chuck 20 to parallelly face the shower head 18. Further, the supporting portion 12 supports the electrostatic chuck 20 to be positioned in the vicinity of the center of the chamber 11 with a predetermined distance from the shower head 18. With such a structure, the shower head 18 and the electrostatic chuck 20 constitute a pair of parallel plate electrodes.

Further, the electrostatic chuck 20 has an electrostatic chuck mechanism such as a chuck electrode 26 that electrostatically attracts the wafer 100. A feeder line 45 for supplying direct current power is connected to the chuck electrode 26. A suction power supply 46 is connected to the feeder line 45. Other internal configurations of the electrostatic chuck 20 will be described below.

A feeder line 41 for supplying radio frequency power is connected to the electrostatic chuck 20 functioning as the lower electrode. A blocking capacitor 42, a matching box 43, and a radio frequency power supply 44 are connected to the feeder line 41. Radio frequency power having a predetermined frequency is supplied from the radio frequency power supply 44 to the electrostatic chuck 20 at the time of plasma processing.

An insulator ring 15 is disposed on an outer periphery of the electrostatic chuck 20 to cover peripheral edge portions of the side surface and the bottom surface of the electrostatic chuck 20. A focus ring 16 is provided on the upper outer periphery of the electrostatic chuck 20 covered with the insulator ring 15. The focus ring 16 adjusts an electric field not to deflect in a vertical direction (a direction perpendicular to a wafer surface) at the peripheral edge portion of the wafer 100 at the time of etching the wafer 100.

A baffle plate 17 is provided between the insulator ring 15 and a side wall of the chamber 11. The baffle plate 17 has a plurality of gas discharge holes 17e penetrating in the plate thickness direction.

A gas exhaust port 14 is provided in a portion of the chamber 11, the portion being located lower than the baffle plate 17. A vacuum pump (not illustrated) as exhaust unit is connected to the gas exhaust port 14 through piping.

A region partitioned by the electrostatic chuck 20 and the baffle plate 17, and the shower head 18 in the chamber 11 serves as a plasma processing chamber 61. An upper region in the chamber 11 partitioned by the shower head 18 serves as a gas supply chamber 62. A lower region in the chamber 11 partitioned by the electrostatic chuck 20 and the baffle plate 17 serves a gas exhaust chamber 63.

The wafer 100 to be processed is placed on the electrostatic chuck 20 and is attracted by the electrostatic chuck mechanism at the time of plasma processing for the wafer 100. Further, the chamber 11 is evacuated by the vacuum pump (not illustrated) connected to the gas exhaust port 14. When the inside of the chamber 11 reaches a predetermined pressure, the processing gas is supplied from the gas supply device (not illustrated) to the gas supply chamber 62 and is supplied to the plasma processing chamber 61 through the gas discharge ports 18g of the shower head 18. A radio frequency voltage is applied to the electrostatic chuck 20 as the lower electrode to generate plasma in the plasma processing chamber 61 in a state where the shower head 18 as the upper electrode is grounded. A potential gradient is generated between the plasma and the wafer 100 due to self bias by the radio frequency voltage on the lower electrode side, ions in the plasma are accelerated to the electrostatic chuck 20, and anisotropic etching processing is performed.

Next, a detailed configuration of the electrostatic chuck 20 will be described.

The electrostatic chuck 20 is provided with a base material 21 made of aluminum, for example. The base material 21 has a flat upper surface. A plate-like heater 23 is disposed on an upper surface of the base material 21 via an adhesive layer 22. The heater 23 raises the temperature of the wafer 100. A soaking plate 24 such as an aluminum plate is disposed on an upper surface of the heater 23. The soaking plate 24 keeps the temperature distribution within a plane of the wafer 100 uniform. Outer peripheries of the adhesive layer 22, the heater 23, and the soaking plate 24 are covered with an adhesive protective layer 25 such as an epoxy resin. The adhesive protective layer 25 protects the adhesive layer 22, the heater 23, and the soaking plate 24 from the plasma. A ceramic plate 27 in which the chuck electrode 26 is embedded is disposed on an upper surface of the soaking plate 24. The ceramic plate 27 is made of, for example, aluminum oxide or aluminum nitride. A plurality of bumps 27b is disposed on an upper surface of the ceramic plate 27 as a placing plate of the wafer 100 by embossing or the like, and supports the wafer 100.

A plurality of gas holes 28 penetrating from the base material 21 to the ceramic plate 27 is provided in the electrostatic chuck 20. A gas supply pipes (not illustrated) is connected to the plurality of gas holes 28. An inert gas such as a He gas is supplied to a gap between the upper surface of the ceramic plate 27 and a back surface of the wafer 100 through the gas supply pipe, and transfers the heat of the heater 23 to the wafer 100.

A plurality of lift pin storage holes 29 penetrating from the base material 21 to the ceramic plate 27 is provided in the electrostatic chuck 20. An insulating supporting member 29s is provided on an inner wall of each lift pin storage hole 29. An upper end portion of the supporting member 29s has an inclined shape in which a center direction side of the lift pin storage hole 29 becomes low. With the shape, dust accumulation in the upper end portion of the supporting member 29s can be suppressed. The supporting member 29s supports a cover of a lift pin to be described below at the upper end portion. Lift pins (not illustrated) are respectively stored in the plurality of lift pin storage holes 29. At the time of loading the wafer 100 into or out of the chamber 11, the plurality of lift pins supports the wafer 100 at a transfer position above the electrostatic chuck 20.

(Configuration Example of Lift Pin and Cover)

Figure 2:
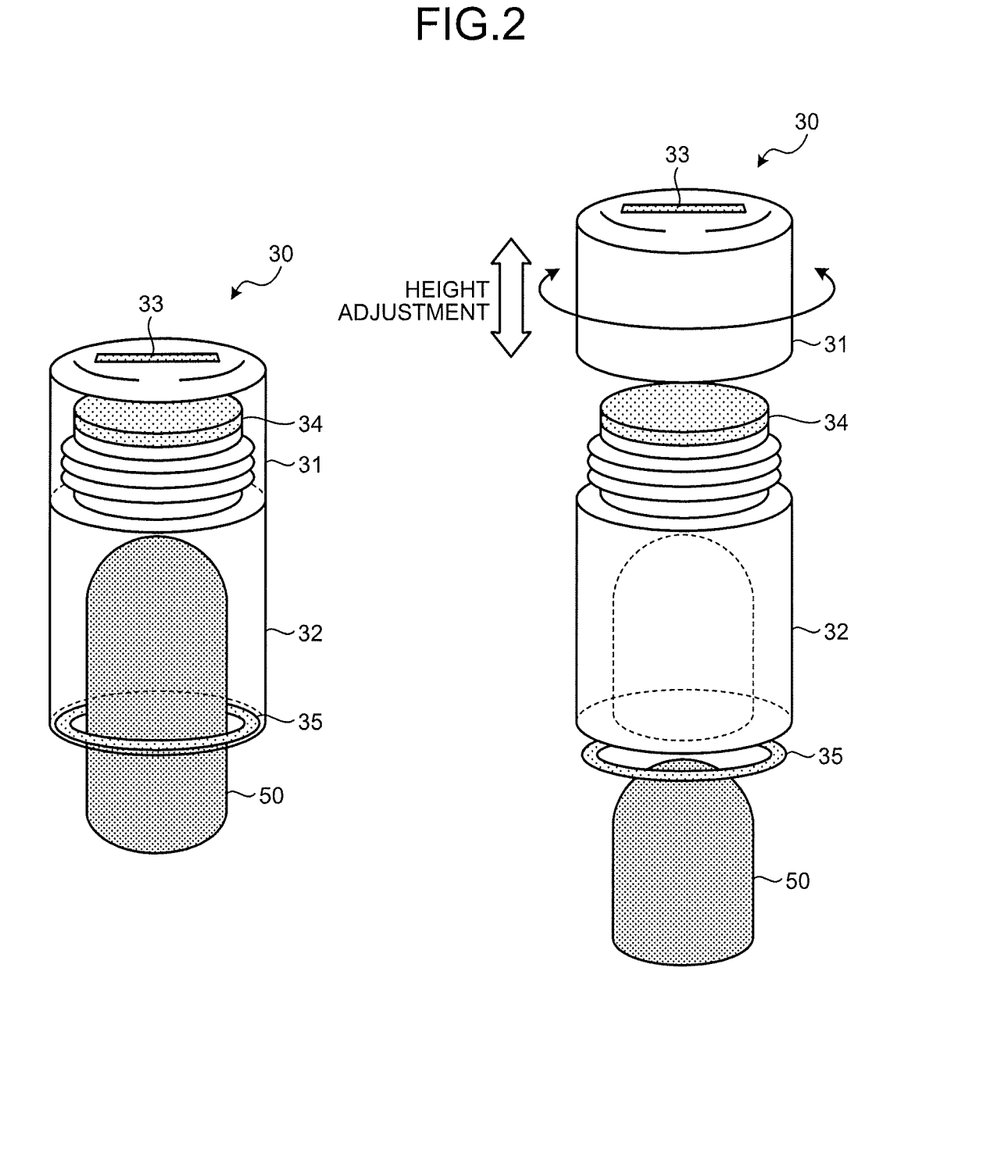
FIG. 2 is a view schematically illustrating an example of configurations of a lift pin and a cover according to the first embodiment.

Next, a lift pin 50 and a cover 30 will be described with reference to FIG. 2 and FIGS. 3A and 3B. FIG. 2 is a view schematically illustrating an example of configurations of the lift pin 50 and the cover 30 according to the first embodiment.

As illustrated in FIG. 2, the individual lift pin 50 is a rod-like member that can be inserted into the lift pin storage hole 29 of the electrostatic chuck 20. An upper end portion of the lift pin 50 has, for example, a round test tube shape. The lift pin 50 is made of, for example, quartz or sapphire. The lift pin 50 protrudes from the lift pin storage hole 29 of the electrostatic chuck 20 and supports the wafer 100 from the back surface.

The cover 30 that covers the upper portion of the lift pin 50 is attachably and detachably covered on the lift pin 50. The cover 30 includes a cap portion 31 that covers an upper end portion of the lift pin 50 and a cylindrical portion 32 that covers a side surface of the lift pin 50. The cap portion 31 and the cylindrical portion 32 are mainly made of aluminum oxide or aluminum nitride, for example, similarly to the ceramic plate 27 of the electrostatic chuck 20.

The cap portion 31 has a tool hole 33 in an upper surface and a screw groove in an inner wall. The cylindrical portion 32 has threads on an upper side surface. By placing a driver or the like against the tool hole 33 in the upper surface of the cap portion 31 and rotating the driver, the cap portion 31 can be fit onto the cylindrical portion 32. At this time, by adjusting a fitting amount, an upper surface height of the cap portion 31 from an upper end of the lift pin 50 can be adjusted.

When the cap portion 31 is fit onto the cylindrical portion 32, a soaking plate 34 is inserted between the cap portion 31 and the cylindrical portion 32. The soaking plate 34 is a plate-like member made of, for example, aluminum, similarly to the soaking plate 24.

A lower end portion of the cylindrical portion 32 has a sealing structure. The sealing structure in the lower end portion is, for example, an annular groove provided in the lower end portion, and the like. For example, an O-ring 35 is fit in the groove in the lower end portion. The O-ring 35 is an annular member made of, for example, elastomer and the like.

Mainly, the electrostatic chuck 20, the lift pins 50, and the covers 30 described above constitute a substrate supporting device that supports the wafer 100 in the chamber 11 of the plasma processing apparatus 1.

Figure 3A:
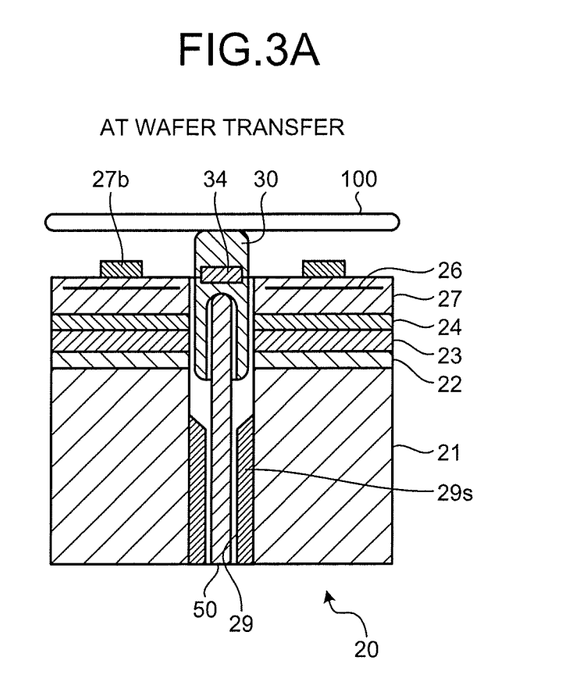
FIGS. 3A and 3B are schematic views illustrating an example of an operation of the lift pin according to the first embodiment.
Figure 3B:
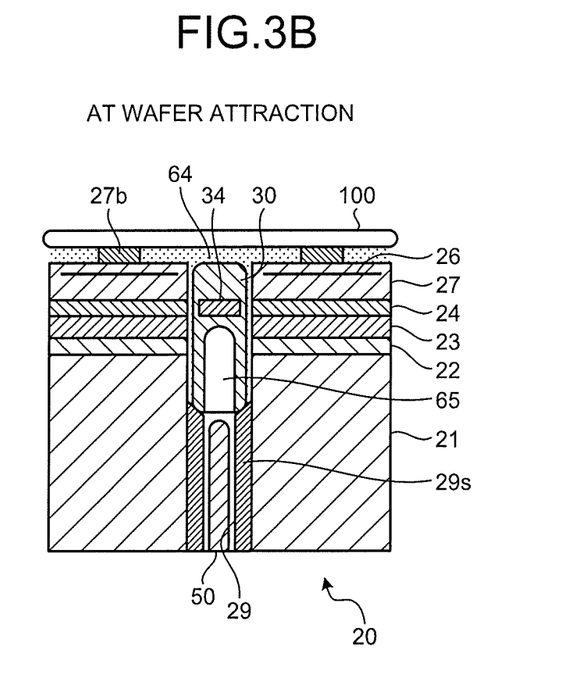

FIGS. 3A and 3B are schematic views illustrating an example of an operation of the lift pin 50 according to the first embodiment.

FIG. 3A illustrates a state in which the lift pin 50 supports the wafer 100 at the transfer position above the electrostatic chuck 20 at the time of loading in and out the wafer 100. FIG. 3B illustrates a state in which the lift pin 50 is stored in the lift pin storage hole 29 of the electrostatic chuck 20. As illustrated in FIGS. 3A and 3B, the wafer 100 can be loaded into or out of the chamber 11 as the lift pin 50 goes up and down while supporting the wafer 100.

Specifically, as illustrated in FIG. 3A, at the time of loading the wafer 100 into or out of the chamber 11, the lift pin 50 protrudes from the electrostatic chuck 20 and supports the wafer 100 at the transfer position above the electrostatic chuck 20. At this time, the lift pin 50 supports the wafer 100 from the back surface side of the wafer 100 via the cover 30. At the transfer position, the wafer 100 is delivered between the lift pin 50 and a robot arm (not illustrated).

The lift pin 50, to which the wafer 100 is delivered from the robot arm, moves down as illustrated in FIG. 3B and is stored in the lift pin storage hole 29 of the electrostatic chuck 20. With the operation, the wafer 100 is placed on the electrostatic chuck 20 and electrostatically attracted by the upper surface of the electrostatic chuck 20 by the electrostatic chuck mechanism. At this time, a He gas or the like is supplied through the gas hole 28 to the back surface of the wafer 100. The He gas is filled in a space surrounded mainly by the back surface of the wafer 100, the ceramic plate 27 of the electrostatic chuck 20, and the bumps 27b provided on the ceramic plate 27, and transfers the heat of the heater 23 to the wafer 100.

Meanwhile, the lift pin 50 moves further downward than the position of the upper end portion of the supporting member 29s in the lift pin storage hole 29. A descent position of the lift pins 50 illustrated in FIG. 3B is a standby position of the lift pins 50 while the wafer 100 undergoes the plasma processing. With the operation, a lower end portion of the cover 30 is supported by the upper end portion of the supporting member 29s, and the cover 30 is detached from the lift pin 50. The height of an upper surface of the cover 30 supported by the supporting member 29s is favorably approximately equal to the height of an upper surface of the ceramic plate 27 of the electrostatic chuck 20. Further, the height of the soaking plate 34 in the cover 30 supported by the supporting member 29s is favorably approximately equal to the height of the soaking plate 24 of the electrostatic chuck 20.

A space surrounded by the cover 30 and the supporting member 29s is formed around the lift pin 50. This space is defined as a lower space 65, and a space surrounded by the back surface of the wafer 100 and the upper surface of the electrostatic chuck 20 is defined as an upper space 64. The sealing structure of the lower end portion of the cover 30 is brought into contact with the upper end portion of the supporting member 29s, whereby a contact portion between the cover 30 and the supporting member 29s is sealed. Therefore, the lower space 65 around the lift pins 50 is isolated from the upper space 64, and entry of the He gas filled in the upper space 64 into the lower space 65 is suppressed.

The lower space 65 is connected to the cylindrical space of the supporting portion 12 (see FIG. 1) protruding from the bottom wall of the chamber 11. This cylindrical space is in a vacuum state on the same level as the inside of the chamber 11 or in a vacuum state with a higher pressure (more positive pressure) than the chamber 11 when at least the chamber 11 is being evacuated. Similarly, the lower space 65 around the lift pins 50 is in a vacuum state or in a vacuum state with a higher pressure (more positive pressure) than the chamber 11.

The effect of the cover 30 configured as described above will be described.

A substrate supporting device constituted by an electrostatic chuck and lift pins has issues of abnormal discharge around the lift pins and nonuniformity of temperature distribution within a plane of a wafer.

During the plasma processing for the wafer, the abnormal discharge may occur between upper end portions of the lift pins and the wafer, between the upper end portions of the lift pins and a chuck electrode, and the like, around the lift pins stored in lift pin storage holes of the electrostatic chuck. Since the lift pin is a rod-like member, the discharge is more likely to occur as described above.

The present inventor has found that the He gas for transferring the heat of the heater to the wafer also has a factor to facilitate the abnormal discharge, in addition to the shape of the lift pin. The He gas or the like for transferring the heat of the heater to the wafer has a low withstand voltage while having high thermal conductivity. Since the periphery of the lift pins is filled with the He gas or the like, it is presumed that the periphery of the lift pins is in an abnormal discharge-prone atmosphere.

Meanwhile, nonuniformity of the wafer temperature tends to occur around lift pin storage holes of the electrostatic chuck. The thermal conductivity and the heat capacity of the He gas or the like are remarkably smaller than members constituting the electrostatic chuck such as a ceramic plate, and the periphery of the lift pin storage holes filled with the He gas or the like has thermophysical properties that are substantially different from the constituent members of the electrostatic chuck.

In the substrate supporting device including the electrostatic chuck 20, the lift pins 50, and the covers 30 of the first embodiment, the lift pin 50 is covered with the insulating cover 30. With the configuration, the abnormal discharge around the lift pins 50 can be suppressed.

Further, in the substrate supporting device of the first embodiment, the lower space 65 around the lift pin 50 is isolated from the upper space 64 filled with the He gas or the like by the O-ring 35 held by the cover 30 at the time of the plasma processing in which the lift pins 50 are stored in the electrostatic chuck 20. With the configuration, the abnormal discharge around the lift pins 50 can be further suppressed.

Further, in the substrate supporting device of the first embodiment, the cover 30 is made of, for example, a ceramic of the same type as the ceramic plate 27 of the electrostatic chuck 20. With the configuration, the thermophysical properties around the lift pin storage holes 29 become approximately equal to those of the ceramic plate 27, and the uniformity of the temperature distribution within the plane of the wafer 100 can be improved.

Further, in the substrate supporting device of the first embodiment, the cap portion 31 and the cylindrical portion 32 of the cover 30 are configured to be adjustable in height. Therefore, at the time of loading in and out the wafer 100, upper end portions of the plurality of covers 30 can be adjusted to approximately the same height. With the configuration, the uniformity of the temperature distribution in the plane of the wafer 100 can be improved without hindering the transfer of the wafer 100.

Further, in the substrate supporting device of the first embodiment, the soaking plate 34 inside the cover 30 is positioned at approximately the same height as the soaking plate 24 of the electrostatic chuck 20, for example, at the time of the plasma processing. With the configuration, the uniformity of the temperature distribution within the plane of the wafer 100 can be further improved.

Second Embodiment

A substrate supporting device according to a second embodiment will be described with reference to FIG. 4 and FIGS. 5A and 5B. The substrate supporting device according to the second embodiment is different from the above-described first embodiment in that an electrostatic chuck is a coolant circulation system having no heater.

Figure 4:
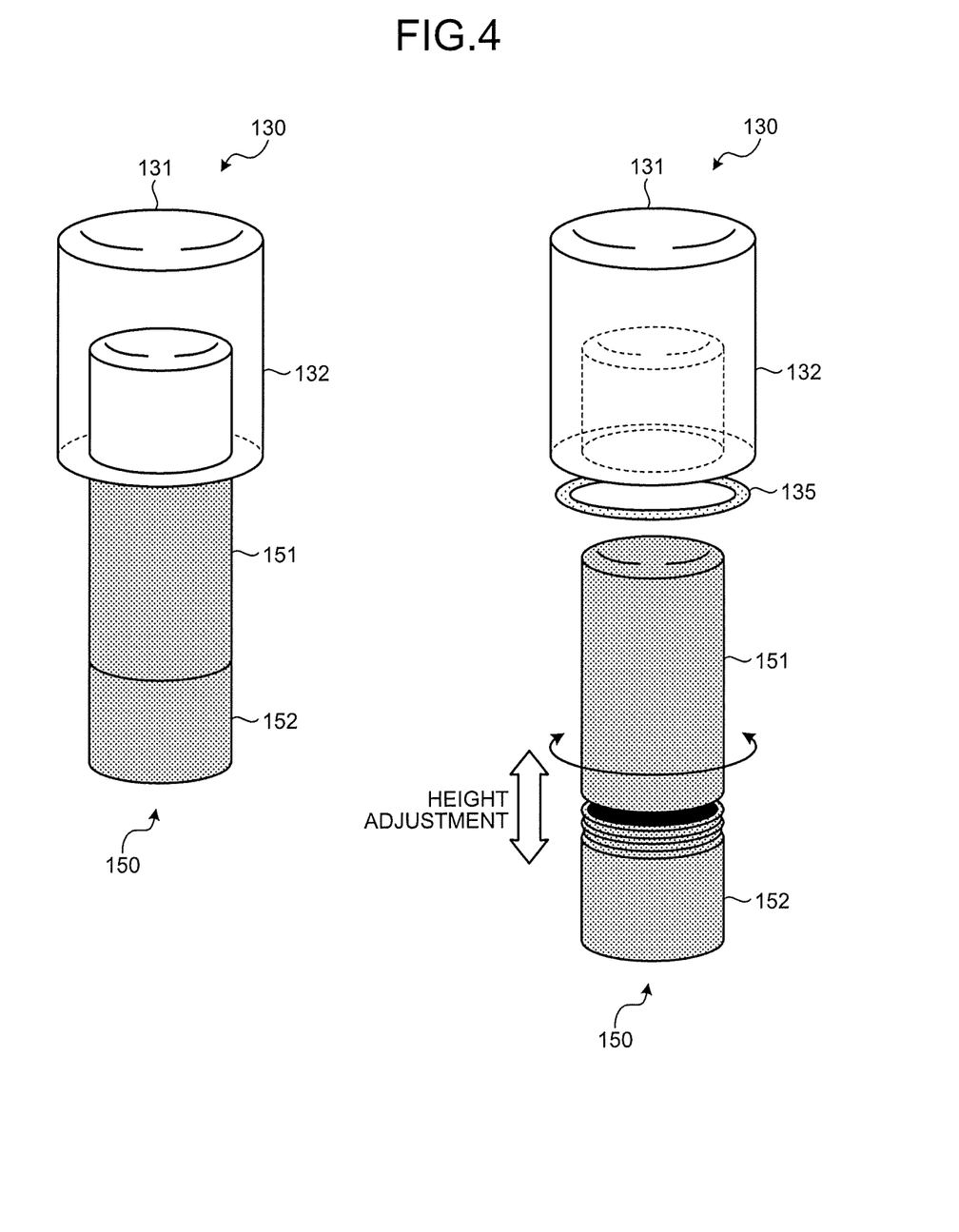
FIG. 4 is a view schematically illustrating an example of configurations of a lift pin and a cover according to a second embodiment.

FIG. 4 is a view schematically illustrating an example of configurations of a lift pin 150 and a cover 130 according to the second embodiment. As illustrated in FIG. 4, the individual lift pin 150 includes a rod-like upper member 151 and a rod-like lower member 152. The upper member 151 and the lower member 152 are made of, for example, quartz or sapphire.

An upper end portion of the upper member 151 has, for example, a chamfered planar shape. A space into which an upper portion of the lower member 152 can be inserted from a lower side of the upper member 151 is provided in a body portion of the upper member 151. A screw groove is provided in an inner wall of the body portion in which the space is provided. The lower member 152 has threads on an upper side surface. By rotating the upper member 151 in a state where the lower member 152 is inserted, the upper member 151 can be fit onto the lower member 152. At this time, the height of an upper surface of the lift pin 150 can be adjusted by adjusting a fitting amount. In a state where the upper member 151 and the lower member 152 are connected in this way, the upper member 151 supports the wafer 100 via the cover 130, and the lower member 152 supports the entire lift pin 150.

The electrostatic chuck of the second embodiment does not include a heater and a soaking plate. Therefore, the cover 130 has a simpler configuration. The cover 130 includes a cap portion 131 that covers an upper end portion of the lift pin 150 and a cylindrical portion 132 that covers a side surface of the lift pin 150, and is configured to be attachable to and detachable from the lift pin 150. The cap portion 131 and the cylindrical portion 132 are integrally formed. The cap portion 131 and the cylindrical portion 132 are mainly made of, for example, aluminum oxide or aluminum nitride.

A lower end portion of the cylindrical portion 132 has a sealing structure. The sealing structure in the lower end portion is, for example, an annular groove provided in the lower end portion, and the like. For example, an O-ring 135 is fit in the groove in the lower end portion.

Next, a configuration of an electrostatic chuck 120 will be described with reference to FIGS. 5A and 5B.

Figure 5A:
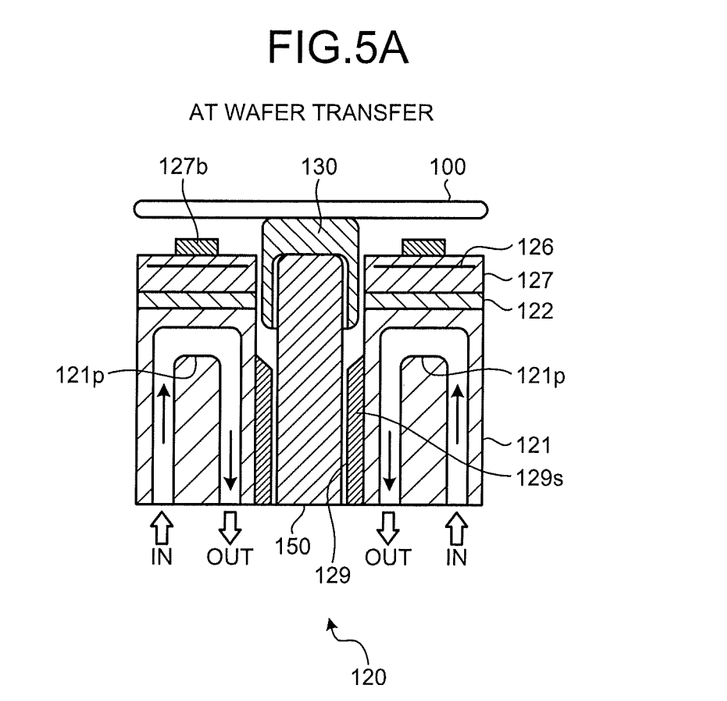
FIGS. 5A and 5B are schematic views illustrating an example of an operation of the lift pin according to the second embodiment.
Figure 5B:
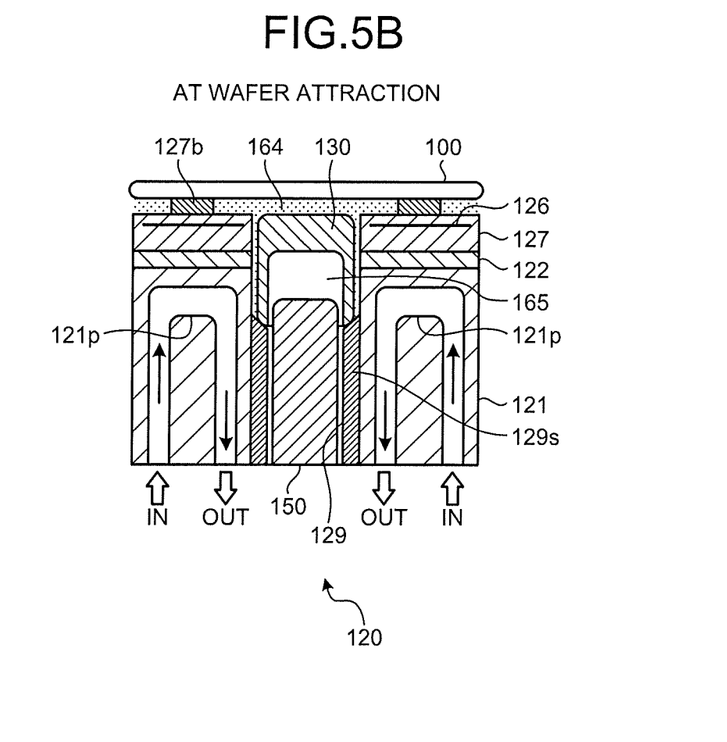

FIGS. 5A and 5B are schematic views illustrating an example of an operation of the lift pin 150 according to the second embodiment. FIG. 5A illustrates a state in which the lift pin 150 supports the wafer 100 at a transfer position above the electrostatic chuck 120 at the time of loading in and out the wafer 100. FIG. 5B illustrates a state in which the lift pin 150 is stored in a lift pin storage hole 129 of the electrostatic chuck 120.

As illustrated in FIGS. 5A and 5B, the electrostatic chuck 120 includes a base material 121 made of aluminum, for example. A flow path 121p is provided inside the base material 121. A supply pipe and a discharge pipe of a coolant (not illustrated) are connected to the flow path 121p, and a chiller is connected to the supply pipe and the discharge pipe of the coolant. With the configuration, the coolant, the temperature of which is adjusted by the chiller, circulates through the flow path 121p inside the electrostatic chuck 120.

The base material 121 has a flat upper surface. A ceramic plate 127 is disposed on the upper surface of the base material 121 via an adhesive layer 122. The ceramic plate 127 is made of, for example, aluminum oxide or aluminum nitride, similarly to the cover 130. A chuck electrode 126 is embedded inside the ceramic plate 127. A plurality of bumps 127b is disposed on an upper surface of the ceramic plate 127 by embossing or the like, and supports the wafer 100.

A plurality of gas holes (not illustrated) penetrating from the base material 121 to the ceramic plate 127 is provided in the electrostatic chuck 120. An inert gas such as a He gas is supplied to a gap between the upper surface of the ceramic plate 127 and a back surface of the wafer 100 through the gas holes and transfers heat of the coolant circulating through the flow path 121p to the wafer 100.

A plurality of the lift pin storage holes 129 penetrating from the base material 121 to the ceramic plate 127 is provided in the electrostatic chuck 120. An insulating supporting member 129s is provided on an inner wall of each lift pin storage hole 129. The lift pins 150 covered with the covers 130 are respectively stored in the plurality of lift pin storage holes 129.

Mainly, the electrostatic chuck 120, the lift pins 150, and the covers 130 in the second embodiment constitute a substrate supporting device of the second embodiment that supports the wafer 100 in the chamber of the plasma processing apparatus.

The operation of the lift pin 150 will be continuously described with reference to FIGS. 5A and 5B.

As illustrated in FIG. 5A, at the time of loading the wafer 100 into and out of the chamber of the plasma processing apparatus, the lift pin 150 protrudes from the electrostatic chuck 120 and supports the wafer 100 via the cover 130 at a transfer position above the electrostatic chuck 120.

As illustrated in FIG. 5B, the wafer 100 is electrostatically attracted by an upper surface of the electrostatic chuck 120 as the lift pin 150 goes down. The He gas or the like is supplied to the back surface of the wafer 100. At this time, an upper space 164 surrounded mainly by the back surface of the wafer 100, the ceramic plate 127 of the electrostatic chuck 120, and the bumps 127b provided on the ceramic plate 127 is formed.

The lift pin 150 moves further downward to a standby position lower than the position of the upper end portion of the supporting member 129s in the lift pin storage hole 129. The lower end portion of the cover 130 is supported by the upper end portion of the supporting member 129s. The height of an upper surface of the cover 130 supported by the supporting member 129s is favorably approximately equal to the height of an upper surface of the ceramic plate 127 of the electrostatic chuck 120. At this time, a lower space 165 surrounded by the cover 130 and the supporting member 129s is formed around the lift pin 150. The lower space 165 is isolated from the upper space 164 filled with the He gas or the like, and is in a vacuum state on the same level as the inside of the chamber or in a vacuum state with a more positive pressure than the chamber.

The substrate supporting device including the electrostatic chuck 120, the lift pins 150, and the covers 130 according to the second embodiment has a similar effect to that of the substrate supporting device according to the first embodiment.

In the substrate supporting device of the second embodiment, the cover 130 can have a simpler configuration in accordance with the configuration of the electrostatic chuck 120.

Other Embodiments

Although the cover 30 or 130 of the above-described first or second embodiment has the sealing structure, the embodiment is not limited to the structure. In a case where the cylindrical space of the supporting portion (see the reference numeral 12 in FIG. 1) protruding from the bottom wall of the chamber is the atmospheric pressure or the like, the lower space around the lift pin may have a more positive pressure than the upper space on the back surface side of the wafer. In that case, the sealing structure is not provided in the lower end portion of the cover, and it is favorable to keep the cover somewhat floating from the upper end portion of the supporting member in the lift pin storage hole of the electrostatic chuck, and allow the atmosphere on the lower space side to flow out to the upper space side. With the configuration, damage to the cover and the wafer due to application of a pressure load to the cover can be suppressed.

In the above-described first or second embodiment, the wafer 100 is delivered to the electrostatic chuck 20 or 120 as the lift pins 50 or 150 go up and down. However, the embodiment is not limited to the operation. The wafer may be delivered to the electrostatic chuck by moving the electrostatic chuck up and down while the positions of the lift pins are kept fixed. In this manner, the operation of the lift pins and the electrostatic chuck is merely relative.

In the above-described first embodiment, the substrate supporting device is mounted on a plasma processing apparatus configured as a parallel plate-type RIE apparatus. However, the embodiment is not limited to the configuration. The plasma processing apparatus on which the substrate supporting device is mounted may be an apparatus using another plasma source such as inductively coupled plasma (ICP). Further, the plasma processing apparatus may be an apparatus that performs plasma processing other than etching such as chemical vapor deposition (CVD) or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate supporting device that supports a substrate in a processing container of a plasma processing apparatus, the substrate supporting device comprising:
   an electrostatic chuck including a placing plate containing at least a ceramic and having the substrate electrostatically attracted by the placing plate, the electrostatic chuck being connectable to a power supply that supplies power to generate plasma in the processing container;
   a lift pin configured to be storable inside the electrostatic chuck and which delivers the substrate to and from the electrostatic chuck; and
   an electrically-insulating cover containing at least a material of ceramic that is a same as a material of the placing plate and configured to be attachable to and detachable from the lift pin, the cover configured to be storable inside the electrostatic chuck together with the lift pin,
   wherein the electrostatic chuck includes:
   a lift pin storage hole in which the lift pin is stored, and
   an insulating supporting member that covers an inner wall of the lift pin storage hole;
   a lower end portion of the cover comes into contact with the supporting member and is supported by the supporting member in a state where the lift pin is stored inside the electrostatic chuck, and
   an upper surface of the cover and an upper surface of the placing plate of the electrostatic chuck are located at an approximately equal height,
   wherein, in a state where the substrate is electrostatically attracted by the placing plate,
   an upper space is formed between the placing plate and the substrate,
   a lower space surrounded by the cover and the supporting member is formed around the lift pin stored in the lift pin storage hole, and
   the upper space and the lower space are isolated.

2. The substrate supporting device according to claim 1, wherein
   the electrostatic chuck includes
   a heater and a first soaking plate under the placing plate, and
   the cover includes
   a second soaking plate inside the cover, the second soaking plate being located at an approximately equal height to the first soaking plate of the electrostatic chuck, in a state where the lift pin is stored inside the electrostatic chuck.

3. The substrate supporting device according to claim 1, wherein
   the cover includes
   a cap portion that covers an upper end portion of the lift pin and a cylindrical portion that covers a side surface of the lift pin, and
   the cap portion is
   configured to be fittable onto the cylindrical portion in a fitting amount adjustable manner.

4. The substrate supporting device according to claim 3, wherein
   the electrostatic chuck includes
   a heater and a soaking plate under the placing plate, and
   the cover includes
   the cap portion fittable onto the cylindrical portion while inserting a member of a same type as the soaking plate.

5. The substrate supporting device according to claim 1, wherein
   the lift pin includes
   a lower member that supports the whole lift pin, and
   an upper member configured to be fittable onto the lower member such that a height of an upper surface of the lift pin with respect to an upper surface of the placing plate is adjustable by adjusting a fitting amount.

6. The substrate supporting device according to claim 1, wherein
   an upper end portion of the supporting member coming into contact with the cover has an inclined shape in which a side of the lift pin storage hole becomes low.

7. A plasma processing apparatus comprising:
   a processing container in which a substrate is processed;
   a power supply that supplies power into the processing container to generate plasma;
   an electrostatic chuck including a placing plate containing at least a ceramic and having the substrate electrostatically attracted by the placing plate in the processing container;
   a lift pin configured to be storable inside the electrostatic chuck and which delivers the substrate to and from the electrostatic chuck; and an electrically-insulating cover containing at least a material of ceramic that is a same as a material of the placing plate and configured to be attachable to and detachable from the lift pin,
wherein the electrostatic chuck includes:
a lift pin storage hole in which the lift pin is stored, and
an insulating supporting member that covers an inner wall of the lift pin storage hole;
a lower end portion of the cover comes into contact with the supporting member and is supported by the supporting member in a state where the lift pin is stored inside the electrostatic chuck, and
an upper surface of the cover and an upper surface of the placing plate of the electrostatic chuck are located at an approximately equal height,
wherein, in a state where the substrate is electrostatically attracted by the placing plate,
an upper space is formed between the placing plate and the substrate,
a lower space surrounded by the cover and the supporting member is formed around the lift pin stored in the lift pin storage hole, and
the upper space and the lower space are isolated.

8. The plasma processing apparatus according to claim 7, wherein
the electrostatic chuck includes
a heater and a first soaking plate under the placing plate, and
the cover includes
a second soaking plate inside the cover, the second soaking plate being located at an approximately equal height to the first soaking plate of the electrostatic chuck, in a state where the lift pin is stored inside the electrostatic chuck.

9. The plasma processing apparatus according to claim 7, wherein
the cover includes
a cap portion that covers an upper end portion of the lift pin and a cylindrical portion that covers a side surface of the lift pin, and
the cap portion is
configured to be fittable onto the cylindrical portion in a fitting amount adjustable manner.

10. The plasma processing apparatus according to claim 9, wherein
the electrostatic chuck includes
a heater and a soaking plate under the placing plate, and
the cover includes
the cap portion fittable onto the cylindrical portion while inserting a member of a same type as the soaking plate.

11. The plasma processing apparatus according to claim 7, wherein
the lift pin incudes
a lower member that supports the whole lift pin, and
an upper member configured to be fittable onto the lower member such that a height of an upper surface of the lift pin with respect to an upper surface of the placing plate is adjustable by adjusting a fitting amount.

12. The plasma processing apparatus according to claim 7, wherein
the lower end portion of the cover coming into contact with the supporting member has a sealing structure.

13. The plasma processing apparatus according to claim 12, wherein
the sealing structure of the cover is formed such that an O-ring is fit into a groove provided in the lower end portion of the cover.

14. The plasma processing apparatus according to claim 7, wherein
an upper end portion of the supporting member coming into contact with the cover has an inclined shape in which a side of the lift pin storage hole becomes low.

15. A substrate supporting device that supports a substrate in a processing container of a plasma processing apparatus, the substrate supporting device comprising:
an electrostatic chuck including a placing plate containing at least a ceramic and having the substrate electrostatically attracted by the placing plate, the electrostatic chuck being connectable to a power supply that supplies power to generate plasma in the processing container;
a lift pin configured to be storable inside the electrostatic chuck and which delivers the substrate to and from the electrostatic chuck; and
an electrically-insulating cover containing at least a material of ceramic that is a same as a material of the placing plate and configured to be attachable to and detachable from the lift pin, the cover configured to be storable inside the electrostatic chuck together with the lift pin,
wherein the electrostatic chuck includes:
a lift pin storage hole in which the lift pin is stored, and
an insulating supporting member that covers an inner wall of the lift pin storage hole;
a lower end portion of the cover comes into contact with the supporting member and is supported by the supporting member in a state where the lift pin is stored inside the electrostatic chuck,
an upper surface of the cover and an upper surface of the placing plate of the electrostatic chuck are located at an approximately equal height, and
the lower end portion of the cover coming into contact with the supporting member has a sealing structure.

16. The substrate supporting device according to claim 15, wherein
the electrostatic chuck includes
a heater and a first soaking plate under the placing plate, and
the cover includes
a second soaking plate inside the cover, the second soaking plate being located at an approximately equal height to the first soaking plate of the electrostatic chuck, in a state where the lift pin is stored inside the electrostatic chuck.

17. The substrate supporting device according to claim 15, wherein
the cover includes
a cap portion that covers an upper end portion of the lift pin and a cylindrical portion that covers a side surface of the lift pin, and
the cap portion is
configured to be fittable onto the cylindrical portion in a fitting amount adjustable manner.

18. The substrate supporting device according to claim 17, wherein
the electrostatic chuck includes
a heater and a soaking plate under the placing plate, and
the cover includes
the cap portion fittable onto the cylindrical portion while inserting a member of a same type as the soaking plate.

19. The substrate supporting device according to claim 15, wherein
the lift pin includes
a lower member that supports the whole lift pin, and an upper member configured to be fittable onto the lower member such that a height of an upper surface of the lift pin with respect to an upper surface of the placing plate is adjustable by adjusting a fitting amount.

20. The substrate supporting device according to claim 15, wherein
the sealing structure of the cover is formed such that an O-ring is fit into a groove provided in the lower end portion of the cover.

21. A substrate supporting device that supports a substrate in a processing container of a plasma processing apparatus, the substrate supporting device comprising:
an electrostatic chuck including a placing plate containing at least a ceramic and having the substrate electrostatically attracted by the placing plate, the electrostatic chuck being connectable to a power supply that supplies power to generate plasma in the processing container;
a lift pin configured to be storable inside the electrostatic chuck and which delivers the substrate to and from the electrostatic chuck; and
an electrically-insulating cover containing at least a material of ceramic that is a same as a material of the placing plate and configured to be attachable to and detachable from the lift pin, the cover configured to be storable inside the electrostatic chuck together with the lift pin,
wherein the electrostatic chuck includes:
a lift pin storage hole in which the lift pin is stored, and
an insulating supporting member that covers an inner wall of the lift pin storage hole;
a lower end portion of the cover comes into contact with the supporting member and is supported by the supporting member in a state where the lift pin is stored inside the electrostatic chuck,
an upper surface of the cover and an upper surface of the placing plate of the electrostatic chuck are located at an approximately equal height, and
an upper end portion of the supporting member coming into contact with the cover has an inclined shape in which a side of the lift pin storage hole becomes low.

* * * * *